United States Patent [19]

Hilland

[11] Patent Number: 5,130,882

[45] Date of Patent: *Jul. 14, 1992

[54] MULTILAYER CIRCUIT BOARD TRANSIENT PROTECTION DEVICE

[75] Inventor: David H. Hilland, Albuquerque, N. Mex.

[73] Assignee: The United States of America as represented by the Secretary of the Air Force, Washington, D.C.

[*] Notice: The portion of the term of this patent subsequent to Apr. 16, 2008 has been disclaimed.

[21] Appl. No.: 685,420

[22] Filed: Apr. 12, 1991

[51] Int. Cl.⁵ .............................................. H02H 9/04
[52] U.S. Cl. ..................................... 361/56; 361/111; 361/406
[58] Field of Search ................... 361/56, 58, 111, 115, 361/126, 127, 400, 406; 174/36

[56] References Cited

U.S. PATENT DOCUMENTS

| | | | |
|---|---|---|---|
| 4,198,613 | 4/1980 | Whitney | 333/181 |
| 4,675,788 | 6/1987 | Breitling et al. | 361/414 |
| 4,729,752 | 3/1988 | Dawson et al. | 439/620 |
| 4,839,768 | 6/1989 | Daniele et al. | 361/56 |
| 4,860,165 | 8/1989 | Cassinelli | 361/388 |
| 5,008,770 | 4/1991 | Hilland | 361/56 |

Primary Examiner—Steven L. Stephan
Assistant Examiner—E. H. To
Attorney, Agent, or Firm—Bernard E. Franz; Donald J. Singer

[57] ABSTRACT

The device comprises a grommet like tube used in plated through holes in circuit boards. The MCBTPD puts a toroidal shaped non-linear terminal protection device (TPD) such as a surgector or diode between the circuit land and the ground plane. The MCBTPD plated through sleeve is cylindrical in shape and passes through the layers of the circuit board and in contact therewith. The TPD is connected to the bottom of the sleeve in contact with the ground plane of the circuit board. This provides the multilayer circuit board with a component which builds electrical transient protection into a plated-through type of rivet or grommet such as one used to mount electronic circuit elements like transistors or integrated circuits on a circuit board. When an electrical transient appears at the component side of the circuit board on the land which connects to the MCBTPD, a potential voltage develops across the TPD. When the transient voltage reaches a threshold level the TPD conducts the transient voltage to the ground plane.

2 Claims, 1 Drawing Sheet

MULTILAYER CIRCUIT BOARD TRANSIENT PROTECTION DEVICE

RIGHTS OF THE GOVERNMENT

The invention described herein may be manufactured and used by or for the Government of the United States for all governmental purposes without the payment of any royalty.

RELATED PATENT APPLICATIONS

There are two related copending patent applications by applicant, Ser. No. 07/481,920 filed Feb. 20, 1990, now U.S. Pat. No. 5,008,770 issued Apr. 16, 1991, for a Filter Pin Integrated Circuit Socket Kit, and Ser. No. 07/491,803 filed Mar. 8, 1990 for a Retrofit Integrated Circuit Terminal Protection Device.

BACKGROUND OF THE INVENTION

The present invention relates generally to a multilayer circuit board transient protection device (MCBTPD).

Electrical transients can destroy circuit elements. The present technology for protecting ICs from electrical overvoltages involves the use of shielding, filtering, and spark gaps or metal oxide varistors at the "box level" of the system. Zener diodes are used sparingly to protect individual ICs.

United States patents of interest include U.S. Pat. No. 4,675,788, to Breitling, which teaches a multilayer circuit baord having a cylindrical shielding foil interposed between the layers. U.S. Pat. No. 4,729,752 to Dawson, Jr. et al teaches a transient suppression device which conducts transient voltages to an electrical terminal means. U.S. Pat. No. 4,839,768 to Daniele et al teaches a protection plate on a substrate that is interposed between the circuit components and a ground pad. U.S. Pat. No. 4,860,165 to Cassinelli teaches a multilayer semiconductor chip having a plurality of power pins extending therethrough. U.S. Pat. No. 4,198,613 teaches a pin or socket type electrical contact which provides transient protection devices in tubular form.

SUMMARY OF THE INVENTION

An objective of the invention is to provide a multilayer circuit board with a component which builds electrical transient protection into a plate-through type of rivet or grommet such as one used to mount electronic circuit elements like transistors or integrated circuits on a circuit board.

The invention relates to a multilayer circuit board transient protection device (MCBTPD). The device comprises a grommet like tube used in plated through holes in circuit boards. The MCBTPD puts a toroidal shaped non-linear terminal protection device (tpd) such as a surgector or diode between the circuit land and the ground plane. The MCBTPD plate through sleeve is cylindrical in shape and passes through the layers of the circuit board and in contact therewith. The TPD is connected to the bottom of the sleeve in contact with the ground plane of the circuit board. When an electrical transient appears at the component side of the circuit board on the land which connects to the MCBTPD, a potential voltage develops across the TPD. When the transient voltage reaches a threshold level the TPD conducts the transient voltage to the ground plane.

DETAILED DESCRIPTION

The present technology for protecting ICs from electrical overvoltages involves the use of shielding, filtering, and spark gaps or metal oxide varistors at the "box level" of the system. Zener diodes are used sparingly to protect individual ICs.

This invention provides another transient protection option which is installed at the time of circuit board manufacture and must be designed into the board. The unique feature about this invention is the form of packaging which makes the transient protection device (TPD) an integral part of the circuit board. The electronic system designer will specify the requirement for the MCBTPD at critical circuit lands which are most likely to see transient overvoltages such as the signal and power lines on the board and at the most susceptible ICs or transistors.

The grommets or rivets are routinely used now without the MCBTPD and serve only to pass electrical signals from one layer to another. Adding the MCBTPD in place of a conventional grommet will be within the present state of technology of manufacturing techniques but will advance the state of the art in transient protection.

Figure 1:
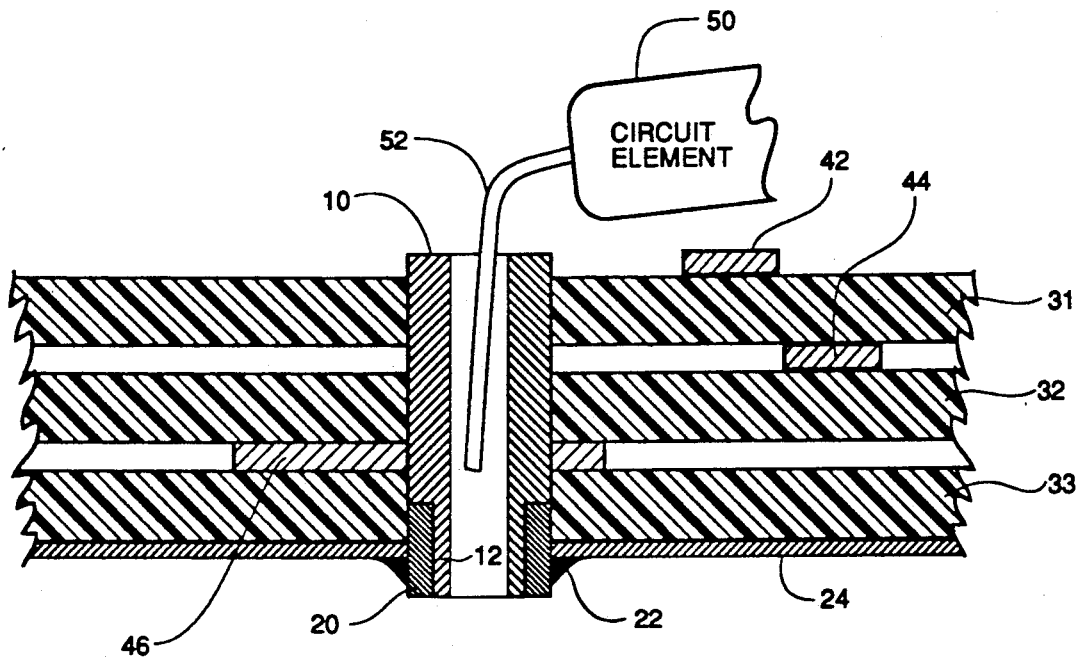
FIG. 1 is a diagram showing a cross section view of a multilayer printed circuit board with a through hole having a metal tubular element inserted through the hole for interconnections, with a transient protection device mounted on one end of the tubular element.

The multilayer circuit board transient protection device (MCBTPD) is shown in FIG. 1 to be a grommet like tube 10 used in plated-through holes in circuit boards. The MCBTPD puts a toroidal shaped non-linear terminal protection device 20 (TPD) such as a Surgector or diode between the circuit land and the ground plane. When an electrical transient voltage potential is seen at the lead 52 of a circuit element 50 such as an integrated circuit or transistor, the MCBTPD protects the circuit element by shunting the electrical transient energy away from the circuit element to the ground plane. Often the lead of the circuit element will be soldered in place in the center hole of the MCBTPD. This device will not be used on every plated-through hole on a circuit board. Only those which require extra protection such as signal or power lines will utilize the MCBTPD. The parasitic capacitance of the MCBTPD will also affect its appropriate application. The MCBTPD will be manufactured in tube form in several diameters to accommodate both discrete leads and smaller integrated circuit leads. The transient clamping voltage of the TPD can be varied to suit the application. Toroidal TPDs can be manufactured in metal-oxide ceramic form, diode form, or other silicon based forms such as the RCA Surgector. The actual TPD material is not critical to this invention. The MCBTPD can be installed by a machine on a typical board assembly line. My U.S. Pat. No. 5,008,770 for a Filter Pin Integrated Circuit Socket Kit issued Apr. 16, 1991, which is hereby incorporated by reference, shows some forms of Terminal Protection Devices.

The MCBTPD is shown in FIG. 1 used with a typical multilayer printed circuit board shown here as having three insulating layers 31, 32 and 33 with circuit lands such as 42, 44 and 46 on the individual layers. Some of these lands make contact with the metal grommet like tubes used for interconnecting the layers. Land 46 is shown as connected to the tube 10, there being a circle of metal at an end of the land surrounding the tube and in contact therewith. The circuit board is shown as having a ground plane 24 at the bottom of the lower layer 33.

Figure 2:
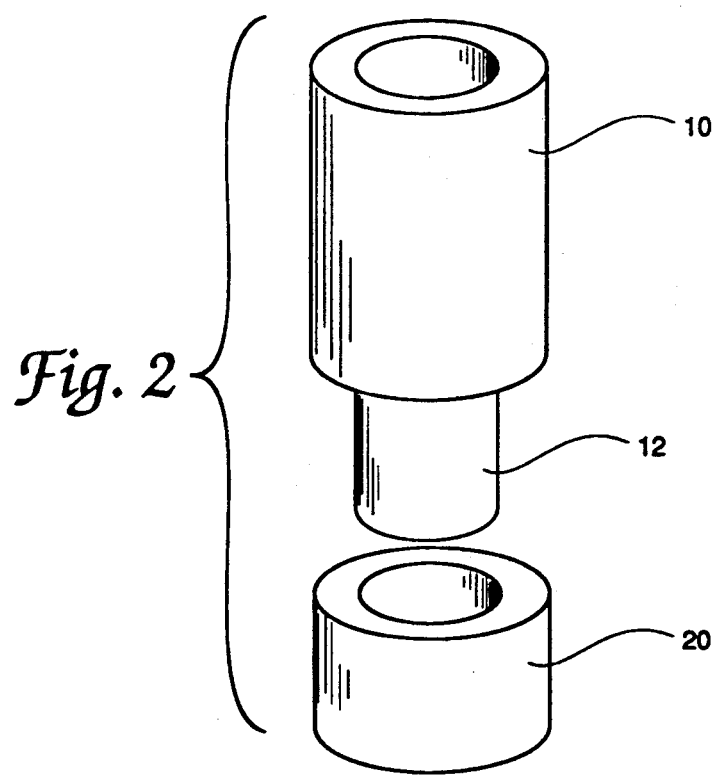
FIG. 2 is a pictorial view of the metal tubular element and the transient protection device.

A cylindrical TPD 20 is built on to one end of the grommet as shown in the drawing. (FIG. 2 shows an exploded view of the metal tube 10 and the cylindrical TPD 20 before assembly.) When no electrical surgage is present, the TPD 20 is an open circuit (with a very small leakage current and a small parasitic capacitance). When an electrical transient is seen at the component side of the circuit board on the land which connects to the MCBTPD, a potential voltage develops across the TPD. When this transient voltage reaches a predetermined design clamping voltage, the TPD begins to conduct and the transient is shunted to the ground plane. This will typically happen within several nanoseconds, depending on the response time of the TPD chosen and the inductance in this aprt of the circuit.

The MCTPD is built to be comparable in size to grommets presently in use on circuit boards. Several sizes will be desirable in order to accommodate the installation of discret transistors or smaller IC leads. There must be a good electrical connection between the grommet and the TPD and between the TPD and the ground plane of the circuit board. (It is not required to use the circuit board ground plane to shunt the transient, but this is the most logical choice in order to minimize coupling to other parts of the system). Each MCBTPD is inserted into the hole in the fiberglass or polymide circuit board so that the required electrical connections can be made. This will most likely be solder around the top of the grommet and friction fit between the outer cylinder of the TPD and the ground plane (Solder 22 may be used between the TPD 20 and the ground plane 24). The TPD in a cylindrical shape is the most desirable for this design as the symmetry will help insure physical strength when the MCBTPD is punched through the hole in the circuit board, but other shapes such as conical TPDs with the point through the ground plane could be used for special applications.

The hole in the top of the MCBTPD is either left open, or used to hold the lead 52 of a transistor or integrated circuit, or possibly a jumper wire. The hole continues through the entire MCBTPD so that it looks like a tube with a band around one end.

The TPD itself will consist of a device such as a diode, metal oxide varistor or any other kind of TPD which can be manufactured with the necessary geometry, in this case cylindrical.

ADVANTAGES AND NEW FEATURES

TPDs are not available in this form. This invention allows greater design flexibility and greater protection of circuit elements to be included during the design phase of an electronic system. When manufactured and used in quantities this invention provides additional transient protection for little extra cost. The MCBTPD installs out of sight and provides a clean uncluttered solution to external circuit element protection which is presently not available in this form. The MBCTPD adds another device to the available TPD inventory, giving a system designer another TPD option to be used with shielding, filtering, and larger box level TPDs in a topologically sounds manner.

ALTERNATIVES

This invention can be fabricated with various clamping voltages and energy dissipation capabilities, depending on the application. A common configuration would be a clamping voltage of about 20 volts. The length of the MCBTPD will vary depending on the number of layers of the board. The metal chosen for the grommet can be chosen to meet Military Specifications or based on strength of material and electrical conduction, with cost under consideration. The TPD will be chosen based on clamping voltage required, power dissipation required, and the amount of parasitic capacitance which is tolerable in the circuit.

It is understood that certain modifications to the invention as described may be made, as might occur to one with skill in the field of the invention, within the scope of the apPended claims. Therefore, all embodiments contemplated hereunder which achieve the objects of the present invention have not been shown in complete detail. Other embodiments may be developed without departing from the scope of the appended claims.

What is claimed is:

1. A transient protection assembly for a multilayer circuit board having a plurality of circuit layers and a ground plane on one of the layers, with through holes for connections between layers, each of said holes having a metallic tube which is cylindrical in shape and passes through said layers of the circuit board, there being a component side of the circuit board, with components having leads inserted into the metallic tubes and conductively secured, some of said metallic tubes having a terminal protection device (TPD) in a form of a toroidal shaped unit mounted on the metallic tube and in contact with the ground plane, whereby when an electrical transient appears at the component side of the circuit board which connects to the metallic tube, a potential voltage develops across the TPD, and when the transient voltage reaches a threshold level the TPD conducts the transient voltage to the ground plane.

2. A transient protection assembly for a multilayer circuit board having a plurality of circuit layers and grounding means, with through holes for connections between layers, each of said holes having a metallic tube which passes through said layers the circuit board, some of said metallic tubes having a terminal protection device (TPD) in a form of a toroidal shaped unit mounted on the metallic tube and in contact with the grounding means, whereby when an electrical transient appears at the metallic tube, a potential voltage develops across the TPD, and when the transient voltage reaches a threshold level the TPD conducts the transient voltage to the grounding means.

* * * * *

UNITED STATES PATENT AND TRADEMARK OFFICE
CERTIFICATE OF CORRECTION

PATENT NO. : 5,130,882
DATED : July 14, 1992
INVENTOR(S) : David H. Hilland

It is certified that error appears in the above-identified patent and that said Letters Patent is hereby corrected as shown below:

Column 1, line 56, "tpd" should be --TPD--.
Column 2, line 54, --transistor-- should follow "discrete".
Column 3, line 12, "surgage" should be --surge--.
Column 3, line 23, "aprt" should be --part--.
Column 3, line 27, "discret" should be --discrete--.
Column 4, line 25, "apPended" should be --appended--.
Column 4, line 53 (claim 2), --of-- should follow "layers".

Signed and Sealed this

Fifth Day of October, 1993

Attest:

BRUCE LEHMAN

*Attesting Officer*     *Commissioner of Patents and Trademarks*